United States Patent [19]

Mitchell et al.

[11] Patent Number: 5,228,772
[45] Date of Patent: Jul. 20, 1993

[54] SOLAR POWERED LAMP HAVING A COVER CONTAINING A FRESNEL LENS STRUCTURE

[75] Inventors: Kim Mitchell, Granada Hills, Calif.; Ronald L. Sitzema, Jr., Ellsworth, Mich.

[73] Assignee: Siemens Solar Industries, L.P., Camarillo, Calif.

[21] Appl. No.: 742,990

[22] Filed: Aug. 9, 1991

[51] Int. Cl.$^5$ .............................................. F21L 13/00
[52] U.S. Cl. ..................................... 362/183; 136/259; 136/291; 359/743
[58] Field of Search ..................... 136/246, 259, 291; 362/183; 359/742, 743

[56] References Cited

U.S. PATENT DOCUMENTS

| | | | |
|---|---|---|---|
| 801,766 | 10/1905 | Churchill | 362/337 |
| 3,833,804 | 9/1974 | Vesely | 240/125 |
| 4,069,812 | 1/1978 | O'Neill | 136/246 |
| 4,116,223 | 9/1978 | Vasilantone | 126/435 |
| 4,175,661 | 11/1979 | Barnes | 206/519 |
| 4,257,084 | 3/1981 | Reynolds | 362/31 |
| 4,321,417 | 3/1982 | Kurth et al. | 136/246 |
| 4,326,012 | 4/1982 | Charlton | 429/9 |
| 4,711,972 | 12/1987 | O'Neill | 136/246 |
| 4,723,535 | 2/1988 | Lew | 126/439 |
| 4,755,804 | 7/1988 | Levati et al. | 340/642 |
| 4,774,648 | 9/1988 | Kakuk et al. | 362/302 |
| 4,835,664 | 5/1989 | Wen | 362/183 |
| 4,841,416 | 6/1989 | Doss | 362/183 |
| 4,999,060 | 3/1991 | Szekely et al. | 136/251 |

OTHER PUBLICATIONS

L. W. James, et al., *Conf. Record, 13th IEEE Photovoltaic Specialists Conf.* (1978), pp. 673–679.
M. J. O'Neill et al., *Conf. Record, 20th IEEE Photovoltaic Conf.* (1988), pp. 1007–1012.

*Primary Examiner*—Aaron Weisstuch
*Attorney, Agent, or Firm*—Nilsson, Wurst & Green

[57] ABSTRACT

A solar powered light comprises a cover containing a fresnel lens structure (also referred to as a fresnel lens cover) which is disposed directly above and adjacent to a photovoltaic cell thereof. The fresnel lens cover comprises a continuous and smooth outer surface and a prismatic inner surface having a plurality of prismatic means arranged in concentric circles to bend incoming radiation, especially at high angles of incidence, such as during winter months or at the beginning or end of a day, toward an optical axis thereof. The prisms have different thicknesses and are arranged in different angular configurations to accomplish the desired bending at each point of the cover. In a preferred embodiment, additional prismatic means are formed on a peripheral portion of the outer surface to cover a photodetector used for sensing the absence of light and triggering circuitry to turn on the solar powered lights.

14 Claims, 4 Drawing Sheets

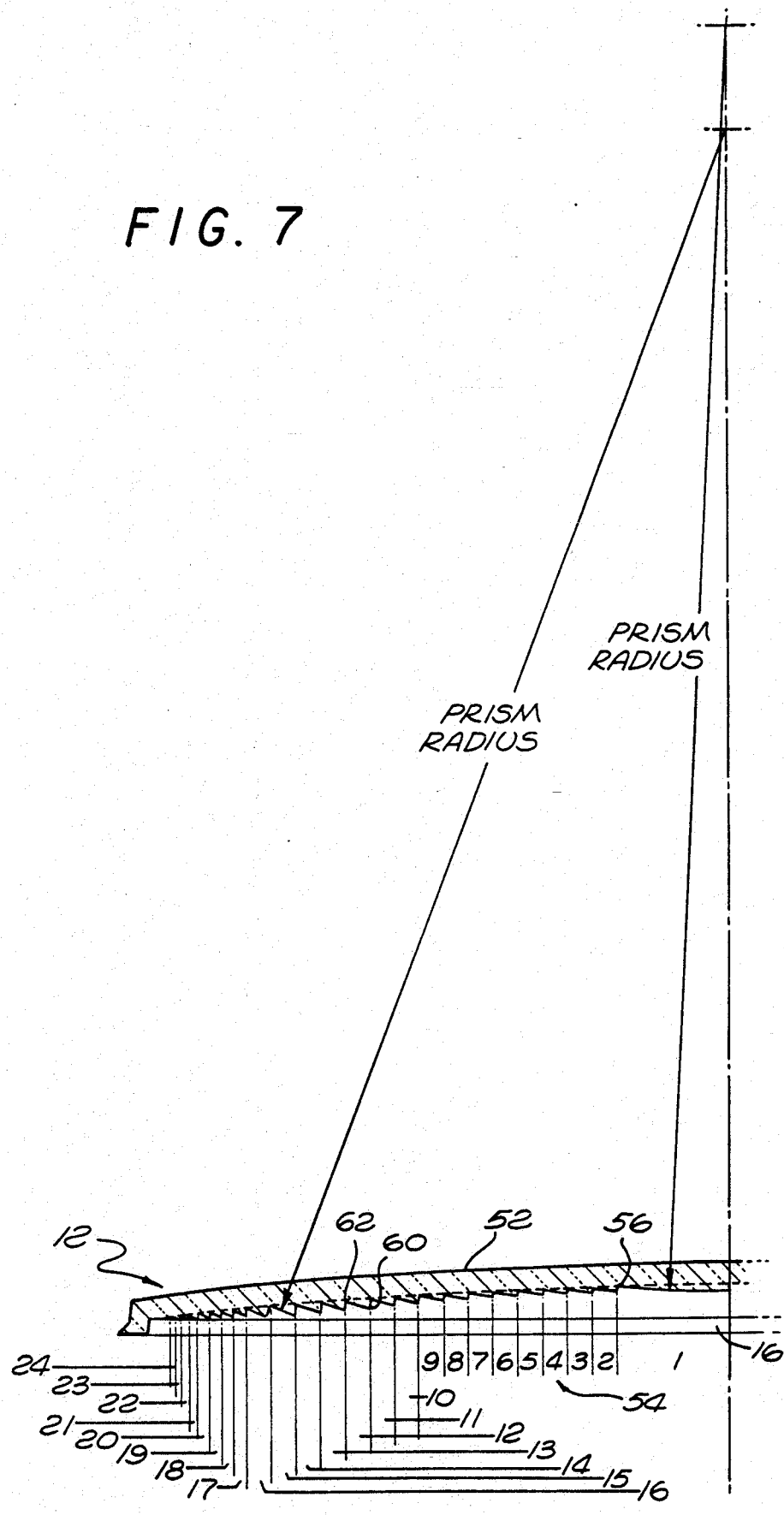

SOLAR POWERED LAMP HAVING A COVER CONTAINING A FRESNEL LENS STRUCTURE

FIELD OF THE INVENTION

The present invention relates generally to solar powered lights. More specifically, the present invention relates to a cover containing a fresnel lens structure for use on solar powered lights.

BACKGROUND OF THE INVENTION

Electrically powered outdoor lighting systems are used to illuminate pathways, yards, parks and other like outdoor areas for security purposes. Commonly, such lights are connected to public utility systems or similar sources of electrical power, and are controlled by preset timing devices to illuminate desired areas at nightfall and automatically turn off at a predetermined time, for example, prior to daybreak.

Many conventional lighting devices require extensive cabling, suitable timing mechanisms and the like, and are thus relatively expensive to install and maintain. In addition, such lighting devices utilize electric power generated in a conventional manner such as by burning fuel. Burning fuel contributes to contamination of the environment and depletion of existing fuel resources.

More recently, self-contained solar powered illumination devices which utilize photovoltaic devices to charge batteries which, in turn, activate a light source contained therein, in the absence of sunlight, have been used for illumination and/or decorative purposes. Such self-contained devices are desirable because they are relatively inexpensive and require hardly any maintenance.

A plurality of such lights can be disposed in any predetermined arrangement, as desired, by pressing the light into the earth to position the lamp at a desired delineation or demarkation position. By thus positioning a plurality of the lights, a particular area, such as a pathway, may be easily delineated so that a person, even in complete darkness, may be able to follow the pathway without the necessity of producing sufficient light to illuminate the pathway.

Typically, solar powered lights include self-contained electrical storage devices, such as a battery which is maintained in a charged condition by a photovoltaic or solar cell array. Photovoltaic cells convert sunlight into electricity. A power supply electrical circuit controls the flow of current to a bulb contained within the solar powered light. The electrical power from the battery is supplied to the light bulb when the solar cell array is not producing electricity, that is, when the ambient light falls below a predetermined level and there is insufficient sunlight.

Although such solar powered illumination devices have been known to serve their purpose, they have not proven to be entirely satisfactory. During winter months, the run time of such solar powered lamps is about 30-35% of the run time obtained during the summer months because a large proportion of the sun's rays is reflected at the higher angles of incidence encountered during the winter. The same occurs at the beginning and end of a day, when the light levels are low and the angles of incidence are high.

Moreover, in present solar light constructions, the photovoltaic cells have substantially rectangular or square configurations. Thus, in circular solar lights there are substantial dead areas, such as at the four quadrants. Light impinging on these dead areas is not absorbed by the photovoltaic cell. Such lost radiation reduces the potential of current development by the solar powered light, which in turn affects the run time of the light.

In the past, because solar cells are expensive to produce, prior techniques have improved the efficiency of photovoltaic solar energy systems by attempting to focus incident sunlight from a large area onto smaller solar cells using a solar collector which incorporates optical concentrators. One such concentrator is a linear Fresnel lens. Because operation of such devices increases the radiant energy flux on the solar cells, the electrical current produced increases substantially. To efficiently carry this higher current, more and larger conducting elements are required. Such conducting elements are generally formed on the top of the solar cell itself, which prevents some of the sunlight from reaching the semiconductor material which converts the sunlight into electricity.

It is known in the prior art to provide covers for solar cells which refract incident sunlight away from conducting elements and concentrate it onto active cell areas. U.S. Pat. No. 4,711,972 to O'Neill discloses a solar cell cover geometry to improve the efficiency of solar cells used in a solar cell collector. The cover comprises a plurality of refractive prisms formed on the surface of the material, such prisms configured to refract incident sunlight onto small active cell areas rather than partially onto non-active conducting elements. Furthermore, the cover is configured such that a portion of the sunlight reflected from the cover itself is admitted into the cover and thereafter impinges upon the small active cell areas. The cover assembly of the O'Neill patent is also highly directional, requiring careful orientation and tracking relative to the sun.

Thus, a need exists for a means of effectively absorbing available radiation and increasing the run time of solar powered lights all year around and especially during winter months or at low ambient light levels.

SUMMARY OF THE INVENTION

The present invention provides a cover containing a fresnel lens structure for use in solar powered lights which is disposed directly above and adjacent to a photovoltaic cell thereof. The fresnel lens cover has an optical axis and a smooth continuous outer surface for receiving solar radiation. An inner surface thereof has a plurality of prismatic means for bending incoming radiation toward the optical axis.

In a further aspect of the invention, the plurality of prismatic means are arranged in concentric circles to bend incoming radiation, especially at high angles of incidence, such as during winter months or at the beginning or end of a day, toward the optical axis. This occurs regardless of angular orientation. The prismatic means are of different thicknesses and angular configurations.

In another aspect of the invention, a plurality of additional prismatic means are formed on a peripheral portion of the outer surface to cover a photodetector used for sensing absence of light and triggering circuitry associated therewith to cause the solar powered lights to turn on.

These as well as other features of the invention will become apparent from the detailed description which follows, considered together with the appended drawings.

BRIEF DESCRIPTION OF THE DRAWINGS

A preferred embodiment of the present invention is illustrated in and by the following drawings in which like reference numerals indicate like parts and in which:

FIG. 7 is a portion of the cross sectional view of the structure illustrated in FIG. 5 showing the configuration of prisms.

DETAILED DESCRIPTION OF THE PREFERRED EMBODIMENT

Figure 1:
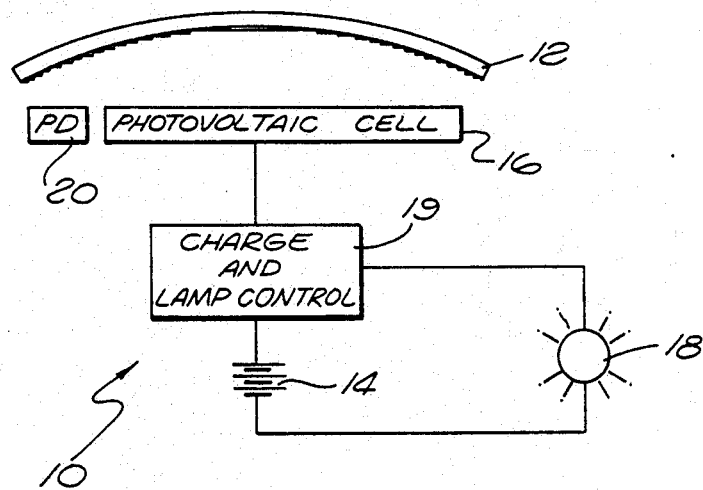
FIG. 1 is a schematic representation of a solar powered lamp having a cover containing a fresnel lens structure in accordance with a preferred embodiment of the present invention.

Referring now to the drawings, FIG. 1 shows generally a solar powered lamp 10 having a cover containing a fresnel lens structure (referred to as a fresnel lens cover) indicated at 12. The embodiment illustrated herein merely exemplifies the invention, which may take forms different from the specific embodiments disclosed.

The solar powered lamp 10 includes one or more self-contained electrical storage devices, such as a battery 14 of conventional design (preferably Nickel-Cadmium or the like), which is maintained in a charged condition by a photovoltaic cell 16, which applies electrical power to a light source 18 through a charge and lamp control circuit 19. The light source 18 can be an incandescent or fluorescent lamp. As is well known to those skilled in the art, the photovoltaic cell 16, when generating electrical power as a result of light striking the same, is used to charge the battery 14 and during such period of time, there is no need for the light source 18 to provide light. Thus, the light source 18 is disconnected from the power source during such time whether it be the photovoltaic cell 16 or the battery 14. However, when the voltage generated by photovoltaic cell 16 drops below a predetermined level, as established by the level of the ambient light, then the power source consisting of the battery 16 is automatically connected so as to illuminate the light source 18. A photodetector 20, such as a cadmium sulfide sensor, typically used in the solar powered lamp 10 to sense the presence or absence of light, connects the battery 14 to the light source 18 to provide power thereto when it does not detect light. Upon sensing light, the photodetector 20 provides a low resistance and in the absence of light the photodetector 20 provides a high resistance.

The fresnel lens cover 12 encapsulates the photovoltaic cell 16 for receiving incident solar energy and generating electrical energy. The photovoltaic cell 16 can be a single cell or a plurality of cells packaged together to cover a preselected surface. Light rays indicated at 37 (FIG. 2) are shown impinging from a variety of directions depending upon the position of the sun relative to the fresnel lens cover 12 and being refracted thereby to fall upon a light activated surface or "active area" of the photovoltaic cell 16. By using the cover 12, a greater percentage of the sunlight is directed and concentrated on the photovoltaic cell 16. Advantageously, the charge time of the battery 14 is increased, increasing the run time of the solar powered light during winter months by approximately at least 25%. For comparison, approximately a 10% increase in run time provides an additional hour of illumination.

Figure 2:
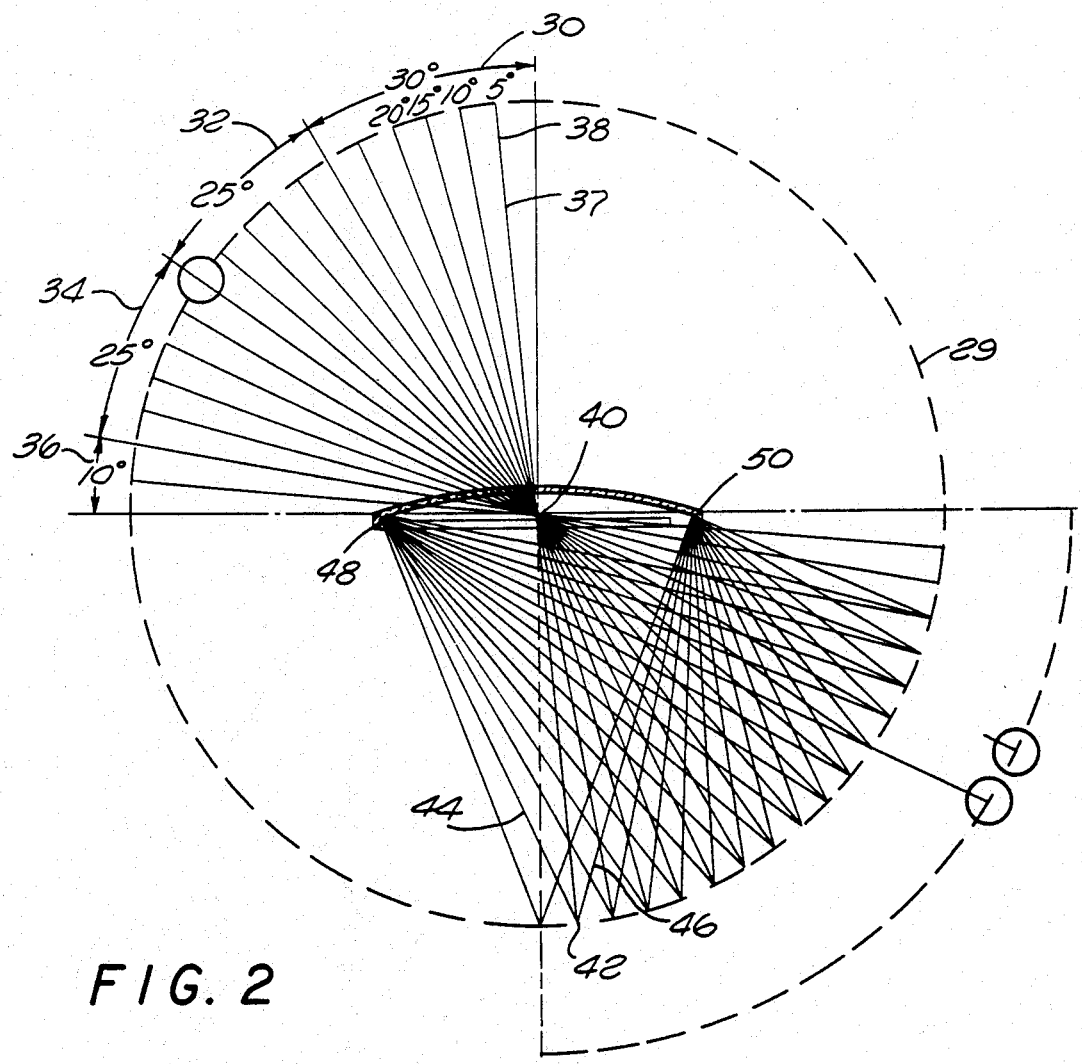
FIG. 2 is a performance analysis diagram of the cover containing a fresnel lens structure showing the manner in which a greater percentage of sunlight is directed onto a photovoltaic cell array disposed thereunder.

Referring now to FIG. 2, a circle 29, which is shown in broken lines, has a radius equal to the focal length (for example, 6.25 inches) of the fresnel lens cover 12. In a first zone indicated at 30, when the sun's rays 37 have low angles of incidence, from 0° (at high noon) to 30°, most of the radiation impinging on the fresnel lens cover 12 is transmitted by it. For example, an exemplary ray indicated at 38 at a 5° angle of incidence which passes through a central point 40 of the fresnel lens cover 12 can be extended through the solar cell 16 to a point 42 on the circle 29. According to known principles of optics, lines 44 and 46 drawn to peripheral edges 48 and 50 of the fresnel lens cover 12 depict the extent of coverage provided by the cover 12 for radiation having a 5° angle of incidence. The extent of coverage for light incident at angles different than 5° can be determined in a similar manner. For radiation falling within the zone 30, the fresnel lens cover 12 increases energy absorption by approximately 40% over prior covers. This increase results primarily from the bending of light incident near the edge of the cover 12 so that sun light impinges on the solar cell 16.

In a second zone 32, when the sun's rays are at angles of incidence from 30° to 55° (a range of 25°), from mid-morning to late afternoon, the fresnel lens cover 12 provides a 25% increase in energy absorption over prior covers. In a third zone 34, when the sun's rays have angles of incidence from 55° to 80° (a range of 25°), the fresnel lens cover 12 provides a 10% increase in energy absorption over prior covers at 55°. In a fourth zone 36, when the sun's rays are at angles of incidence from 80° to 90° (a range of 10°), the fresnel lens cover 12 has little effect.

Figure 3:
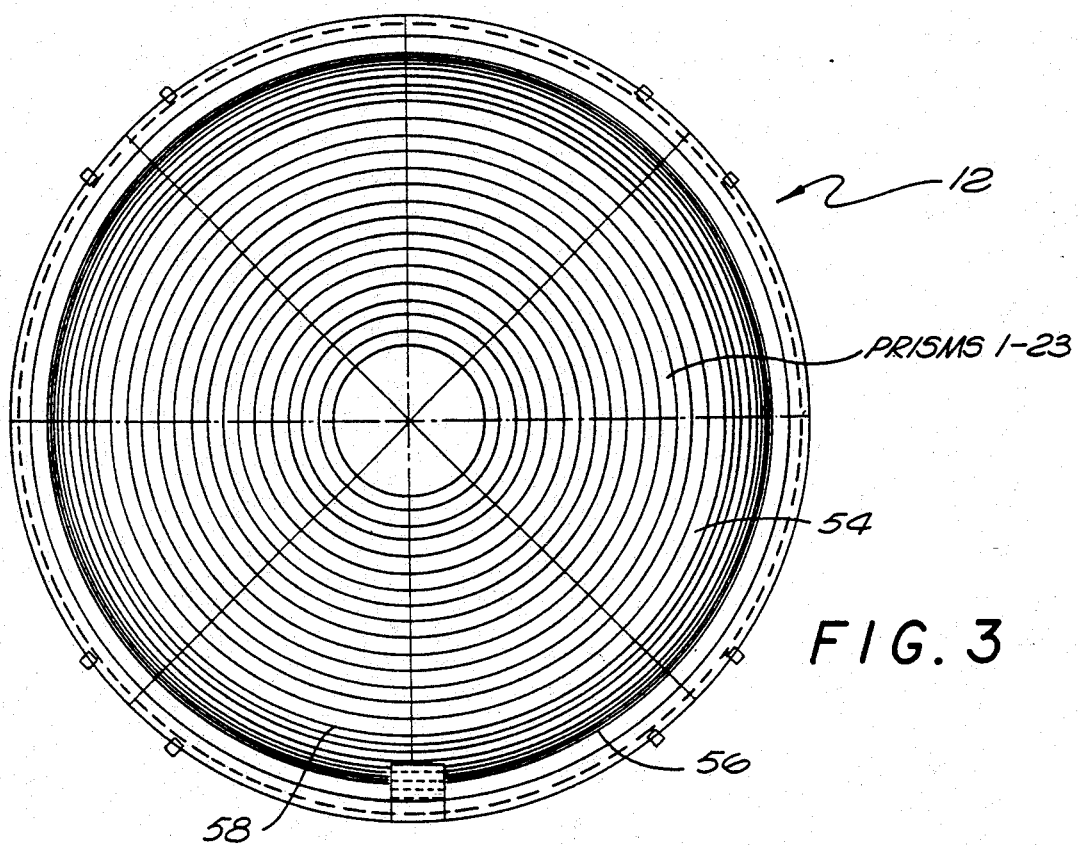
FIG. 3 is a top plan view of an inner surface of the cover of the present invention illustrating a plurality of prismatic means arranged in concentric circles.
Figure 4:
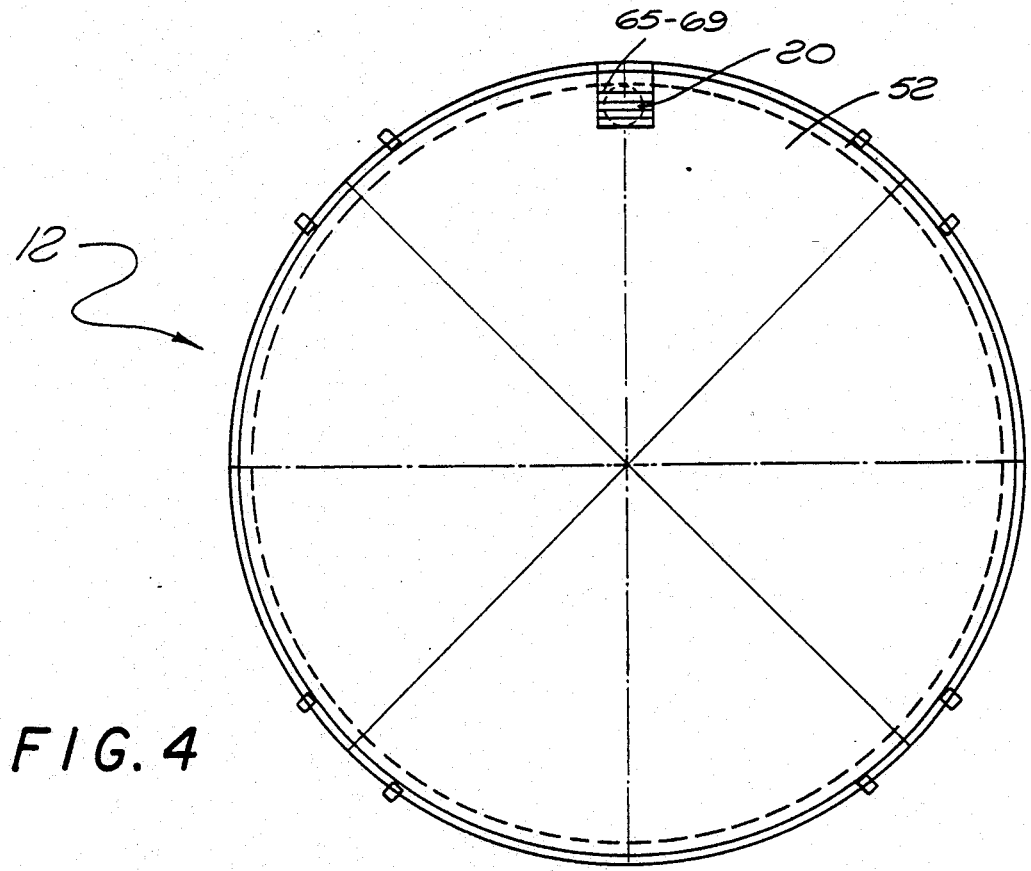
FIG. 4 is a top plan view of a smooth outer surface of the cover of the present invention (the concentric circles although typically seen in this view have been omitted for clarity to illustrate the smooth and continuous nature of the outer surface)
Figure 5:
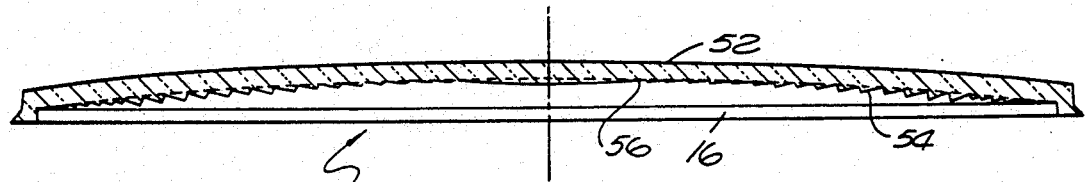
FIG. 5 is a cross sectional view taken along 5—5 of FIG. 3.

Referring now to FIGS. 3, 4, and 5, the fresnel lens cover 12 is an optically clear prismatic cover composed preferably of a suitable polycarbonate material. It has a generally curved configuration, as best shown in FIG. 5. Although the embodiment illustrated herein is generally circular in configuration, the fresnel lens cover 12 can have other suitable configurations, for example rectangular. The fresnel lens cover 12 which is preferably molded as an integral piece, comprises a smooth and continuous outer surface 52 (best shown in FIG. 4) and a plurality of prismatic means 54 (the illustrated embodiment showing prisms 1 through 23, prism 1 disposed at the center of the fresnel lens cover 12 and prism 23 at the peripheral edge thereof) formed on an inner surface 56 thereof. The inner surface 56 is disposed adjacent the photovoltaic cell 16 as best shown in FIG. 1.

prism roots 62 for each prismatic portion 54 (prisms 1–23).

TABLE A

| PRISM NUMBER | ANGLE A | ANGLE B | MAX PRISM HEIGHT MEASURED FROM 0.0 TO PRISM PEAK | PRISM SPACING FOR FRESNEL CUTTING, MEASURED FROM C TO PRISM "ROOT". |
|---|---|---|---|---|
| PRISM #1 | 0°-0'-0" OR $C_L$ | 5°12'42" | .0324 | 0.00–.575 R. |
| PRISM #2 | 5°12'59" | 6°20'55" | .0218 | .575 R. |
| PRISM #3 | 6°21'17" | 7°29'18" | .0279 | .700 R. |
| PRISM #4 | 7°29'43" | 8°37'52" | .0346 | .825 R. |
| PRISM #5 | 8°38'21" | 9°46'38" | .0418 | .950 R. |
| PRISM #6 | 9°47'11" | 10°55'39" | .0497 | 1.075 R. |
| PRISM #7 | 10°56'15" | 12°4'55" | .0582 | 1.200 R. |
| PRISM #8 | 12°5'35" | 13°14'30" | .0674 | 1.325 R. |
| PRISM #9 | 13°15'14" | 14°24'24" | .0771 | 1.450 R. |
| PRISM #10 | 14°25'12" | 15°34'41" | .0875 | 1.575 R. |
| PRISM #11 | 15°35'33" | 16°45'22" | .0985 | 1.700 R. |
| PRISM #12 | 16°46'18" | 17°56'29" | .1101 | 1.825 R. |
| PRISM #13 | 17°57'30" | 19°8'5" | .1224 | 1.950 R. |
| PRISM #14 | 19°8'37" | 19°44'4" | .1077 | 2.075 R. |
| PRISM #15 | 19°44'38" | 20°20'12" | .1135 | 2.1375 R. |
| PRISM #16 | 20°19'0" | 20°56'28" | .1195 | 2.200 R. |
| PRISM #17 | 20°57'4" | 21°32'53" | .1257 | 2.2625 R. |
| PRISM #18 | 21°33'18" | 21°57'12" | .1218 | 2.325 R. |
| PRISM #19 | 21°57'38" | 22°21'36" | .1258 | 2.367 R. |
| PRISM #20 | 22°21'49" | 22°33'49" | .1195 | 2.408 R. |
| PRISM #21 | 22°34'2" | 22°46'11" | .1216 | 2.429 R. |
| PRISM #22 | 22°46'24" | 22°58'19" | .1235 | 2.450 R. |
| PRISM #23 | 22°58'40" | 23°10'36" | .1255 | 2.470 R. |

By forming the prisms 54 on the inner surface 56 (as shown in FIG. 3), even though the cover 12 is typically exposed to severe environmental conditions, the exposed outer surface 52 of the cover 12 does not collect dirt, debris or the like which cause a substantial loss in the amount of sunlight transmitted therethrough. The dome-like shape of the outer surface 52 also facilitates cleaning of the cover 12 by rain, snow and the like.

The plurality of prismatic means or portions 54 are arranged in concentric circles 58 disposed generally over the photovoltaic cells 16. Advantageously, the symmetry of the concentric circles 58 allows the solar powered light 10 to be oriented in any direction about its optical axis without affecting absorption of energy.

Figure 8:
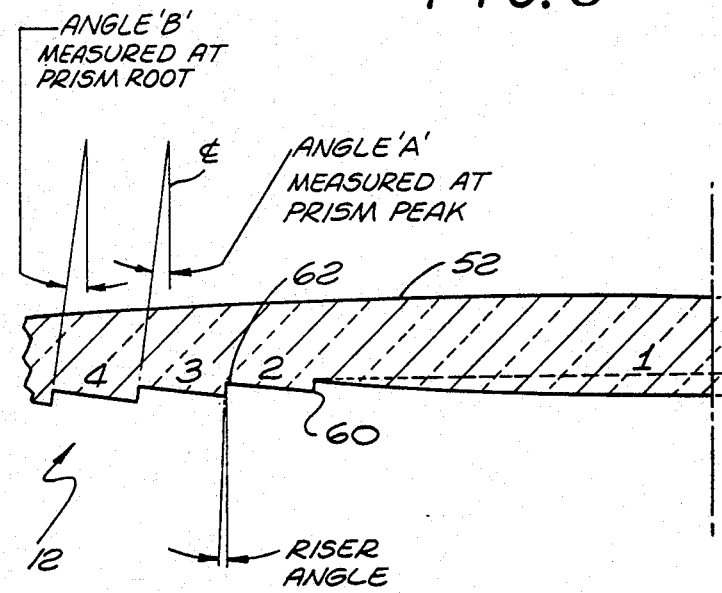
FIG. 8 is an enlarged cross sectional view of prisms 1, 2, 3, and 4 of the structure shown in FIG. 7.

Referring now to FIGS. 7 and 8, the plurality of prismatic means or portions 54 vary in thickness and angular configurations. The prismatic portions 54 form peaks 60 and roots or valleys 62 (best shown in FIG. 8) which are positioned at suitable angles to cause the light rays 37 to be bent by refraction toward the active surface of the photovoltaic cell 16 so that the direction of the light rays forms a smaller angle with the optical axis $C_L$ of the cover 12. As shown in FIG. 7, in an exemplary embodiment, the limits of the prismatic means or portions 54 are defined by orienting a line 6.330 inches in length such that it extends between the optical axis and the lower surface of the cover 12 and forms preselected angles with the optical axis. In an exemplary embodiment, the riser angle (shown in FIG. 8) of each of the peaks 62 is 2°- 0' - 0" (2 degrees, 0 minutes and 0 seconds). Exemplary angles A measured at the prism peak 60 from the central axis $C_L$ through the fresnel lens cover 12 and exemplary angles B measured at the prism roots or valleys 62 from the central axis are set forth in TABLE A for each of the prismatic means or portions 54. TABLE A also provides exemplary values for the maximum prism height measured from the central focal point 0.0 to the prism peak and the prism spacing for fresnel cutting measured from the central axis $C_L$ to the Typically, in solar powered lamps, the photovoltaic cell 16 is positioned such that it is substantially square or rectangular in configuration (FIG. 1). Therefore when used in a circular solar powered lamp, there are dead or inactive areas at the four quadrants where no photovoltaic cells 16 are disposed. Rays 37 that fall on these areas are redirected by the prismatic inner surface 56 so that they impinge upon the active areas of the photovoltaic cells 16.

Figure 6:
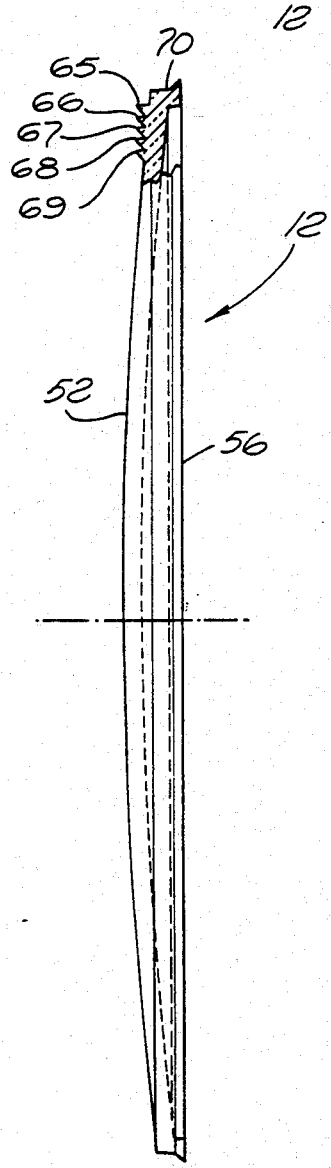
FIG. 6 is a cross sectional view taken along 6—6 of FIG. 4.

Referring now to FIGS. 4 and 6, the fresnel lens cover 12 comprises additional prismatic portions indicated at 65–69, disposed at a location on the outer surface 52 and adjacent one end 70 of the cover 12. The number of such portions is preferably five, but may be any other number desired by one skilled in the art. In a preferred embodiment of the present invention, the photodetector 20 is disposed directly under the prismatic portions 65–69. The prismatic portions 65–69 redirect light rays 37 falling at the end 70 onto the photodetector 20 disposed below. As long as there is sufficient ambient light, light directed onto the photodetector 20 causes the resistance of the photodetector 20 to remain low. The prismatic portions 65–69 project the light rays 37 even at low light levels onto the photodetector 20 keeping it active. Advantageously, this prevents the solar powered lights from turning on before they are required and draining the battery.

Although the invention has been described in terms of a preferred embodiment thereof, other embodiments that are apparent to those of ordinary skill in the art are also within the scope of the invention. Accordingly, the scope of the invention is intended to be defined only by reference to the appended claims.

What is claimed is:

1. A cover for use in solar powered lamps having a photovoltaic cell and having an optical axis, said cover comprising:

a smooth and continuous outer surface portion for receiving solar radiation at an incident angle, wherein a peripheral portion of said outer surface has a first plurality of exterior prismatic means configured to redirect the incoming radiation incident thereon onto a photodetector of the solar powered lamp; and an inner surface portion adapted to be disposed adjacent said photovoltaic cell and having a second plurality of interior prismatic means for bending incoming radiation incident thereon toward said optical axis so that it forms an angle with said optical axis which is smaller than said incident angle.

2. A cover for use in solar powered lamps as defined in claim 1, wherein said second plurality of prismatic means are arranged in concentric circles about said optical axis.

3. A cover for use in solar powered lamps as defined in claim 1, wherein said second plurality of prismatic means have different angular configurations.

4. A cover for use in solar powered lamps as defined in claim 1, wherein said second plurality of prismatic means have different thicknesses.

5. A solar powered lamp, comprising:

a photovoltaic cell for receiving sunlight and generating electrical energy;

an electrical storage device coupled to said photovoltaic cell, said photovoltaic cell transferring said electrical energy to said electrical storage device to illuminate a light source; and a cover having an optical axis, said cover disposed over and adjacent said photovoltaic cell, said cover having a smooth and continuous outer surface for receiving sunlight at an incident angle wherein a peripheral portion of said outer surface has a first plurality of exterior prismatic means configured to redirect the incoming radiation incident thereon onto a photodetector of the solar powered lamp and an inner surface which has a second plurality of interior prismatic means for bending incoming sunlight so that it forms an angle with said optical axis which is smaller than said incident angle.

6. A solar powered lamp as defined in claim 5, wherein said second plurality of prismatic means are arranged in concentric circles about said optical axis.

7. A solar powered lamp as defined in claim 5, wherein said second plurality of prismatic means have different angular configurations.

8. A solar powered lamp as defined in claim 5, wherein said second plurality of prismatic means have different thicknesses.

9. A solar powered lamp having a photovoltaic cell for receiving sunlight and generating electrical energy and a photodetector for sensing the absence of light and turning on said solar powered lamp, comprising:

a cover having an optical axis, said cover disposed over and adjacent said photovoltaic cell, said cover having a substantially smooth outer surface for receiving sunlight at an incident angle, a peripheral portion of said outer surface having a first plurality of exterior prismatic means configured to redirect the incoming radiation incident thereon onto said photodetector.

10. A solar powered lamp as defined in claim 9, wherein said cover has an inner surface portion disposed adjacent said photovoltaic cell having a second plurality of interior prismatic means.

11. A solar powered lamp as defined in claim 10, wherein said second plurality of prismatic means bend said radiation toward said optical axis so that it forms an angle with said optical axis which is smaller than said incident angle.

12. A solar powered lamp as defined in claim 9, wherein said second plurality of prismatic means are arranged in concentric circles about said optical axis.

13. A solar powered lamp as defined in claim 9, wherein said second plurality of prismatic means have different angular configurations.

14. A solar powered lamp as defined in claim 9, wherein said second plurality of prismatic means have different thicknesses.

* * * * *